(12) United States Patent
Kimerling et al.

(10) Patent No.: US 8,242,480 B2
(45) Date of Patent: Aug. 14, 2012

(54) ENGINEERING EMISSION WAVELENGTHS IN LASER AND LIGHT EMITTING DEVICES

(75) Inventors: Lionel C. Kimerling, Concord, MA (US); Jifeng Liu, Cambridge, MA (US); Jurgen Michel, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 89 days.

(21) Appl. No.: 12/821,643

(22) Filed: Jun. 23, 2010

(65) Prior Publication Data

US 2011/0316018 A1     Dec. 29, 2011

(51) Int. Cl.
  *H01L 29/12*    (2006.01)
(52) U.S. Cl. ............... 257/11; 257/86; 257/E33.008; 257/E33.023
(58) Field of Classification Search ......... 257/11–14, 257/79, 86, 90, 94, E33.008, E33.023
See application file for complete search history.

(56) References Cited

U.S. PATENT DOCUMENTS

| 4,616,241 A | 10/1986 | Biefeld et al. |
| 4,944,811 A | 7/1990 | Sukegawa et al. |
| 6,008,507 A | 12/1999 | Lin et al. |
| 7,596,158 B2 | 9/2009 | Liu et al. |
| 2011/0316018 A1 * | 12/2011 | Kimerling et al. ............. 257/94 |

FOREIGN PATENT DOCUMENTS

EP    0617470 A2    9/1994

OTHER PUBLICATIONS

ISR and Written Opinion issued in connection with corresponding PCT Application No. PCT/US2011/041188, mailed on Sep. 30, 2011.

* cited by examiner

*Primary Examiner* — Jack Chen
(74) *Attorney, Agent, or Firm* — Gesmer Updegrove LLP

(57) ABSTRACT

A light emitting device is provided that includes at least one first semiconductor material layers and at least one second semiconductor material layers. At least one near-direct band gap material layers are positioned between the at least one first semiconductor layers and the at least one second semiconductor material layers. The at least one first semiconductor layers and the at least one second material layers have a larger band gap than the at least one near-direct band gap material layers. The at least one near-direct band gap material layers have an energy difference between the direct and indirect band gaps of less than 0.5 eV.

10 Claims, 3 Drawing Sheets

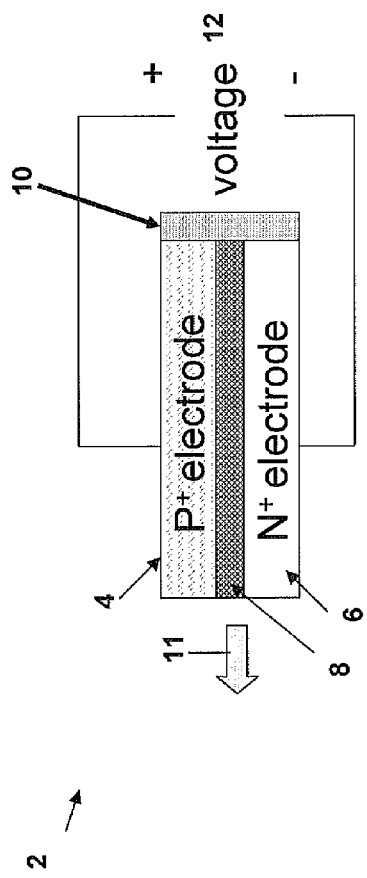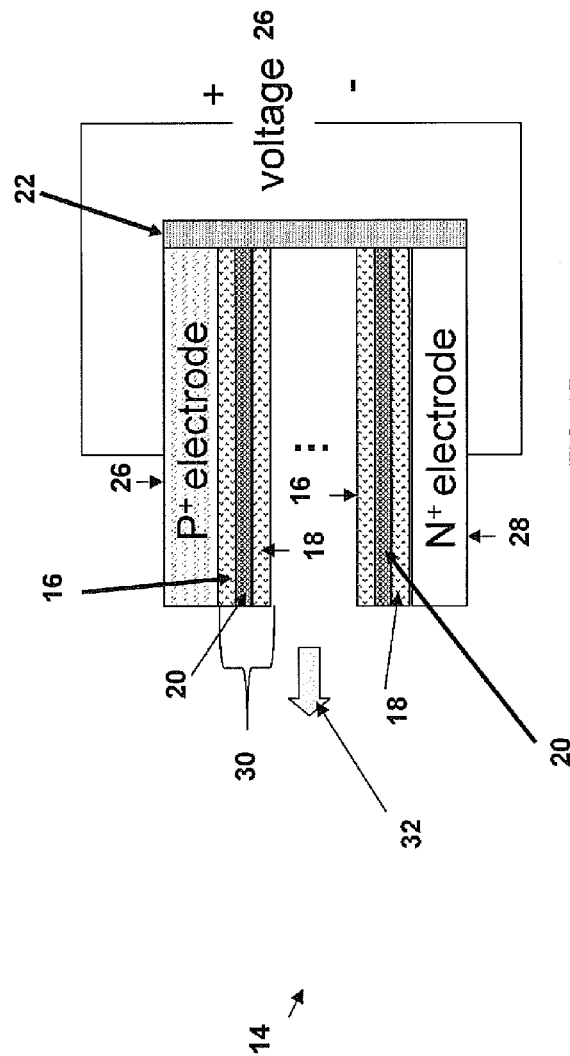

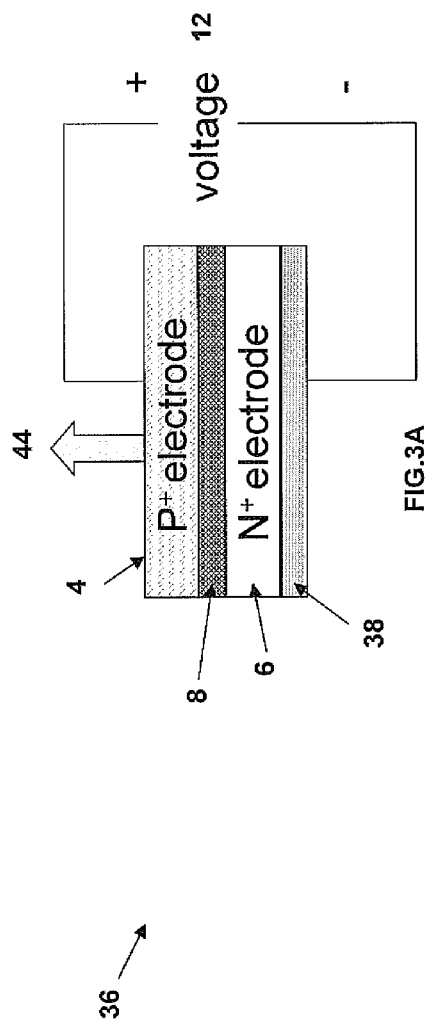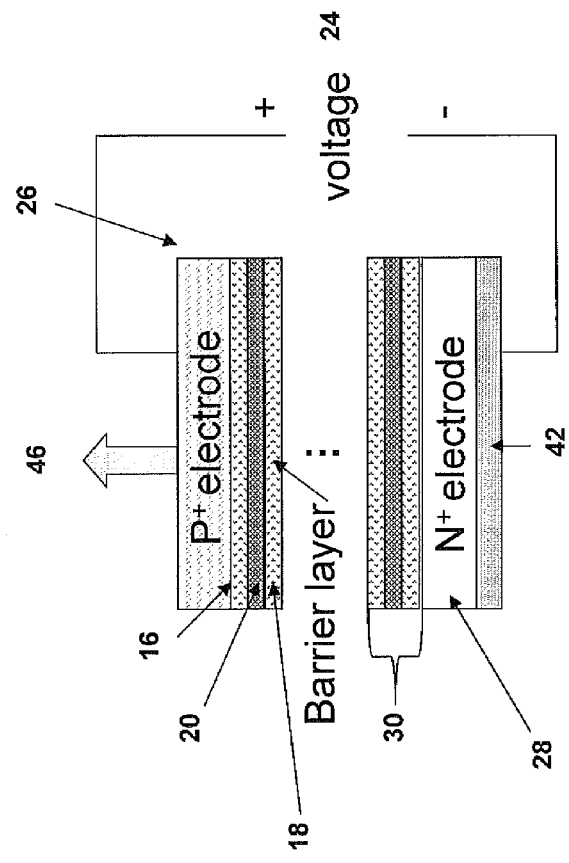

ENGINEERING EMISSION WAVELENGTHS IN LASER AND LIGHT EMITTING DEVICES

BACKGROUND OF THE INVENTION

The invention is related to light emitting devices, and in particular to light emitting devices having indirect bandgap materials.

Truly green semiconductor lasers and LEDs featuring an emission peak wavelength of 530-532 nm, have been a missing component for high quality full color display. InGaN lasers and LEDs emit a bluish-green color at 515 nm, while InGaP lasers and LEDs emit a yellowish-green color at 571 nm. For InGaN system, shifting the emission wavelength to 530 nm is mainly limited by the difficulty in growing high quality, high indium content materials. For InGaP system, tuning the wavelength to 530 nm is limited by a direct-to-indirect gap transition at a Ga content of >72%. Currently, green lasers are achieved by frequency doubling an infrared laser with nonlinear optical materials. However, the efficiency is usually limited to a few percent. much lower than typical semiconductor lasers.

SUMMARY OF THE INVENTION

According to one aspect of the invention, there is provided a light emitting device. The light emitting device includes at least one first semiconductor material layers and at least one second semiconductor material layers. At least one near-direct band gap material layers are positioned between the at least one first semiconductor layers and the at least one second semiconductor material layers. The at least one first semiconductor layers and the at least one second material layers have a larger band gap than the at least one near-direct band gap material layers. The at least one near-direct band gap material layers have an energy difference between the direct and indirect band gaps of less than 0.5 eV.

According to another aspect of the invention, there is provided a method of forming a light emitting device. The method includes forming at least one first semiconductor material layers and forming at least one second semiconductor material layers. Also, the method includes positioning at least one near-direct band gap material layers between the at least one first semiconductor layers and the at least one second semiconductor material layers. The at least one first semiconductor layers and the at least one second material layers have a larger band gap than the at least one near-direct band gap material layers. The at least one near-direct band gap material layers have an energy difference between the direct and indirect band gaps of less than 0.5 eV.

BRIEF DESCRIPTION OF THE DRAWINGS

FIGS. 2A-2B are schematic diagrams illustrating device structures of surface emitting LEDs and lasers using an n-type near-direct gap material formed in accordance with the invention; and FIGS. 3A-3B are schematic diagrams illustrating other embodiments of the invention.

DETAILED DESCRIPTION OF THE INVENTION

Figure 1:
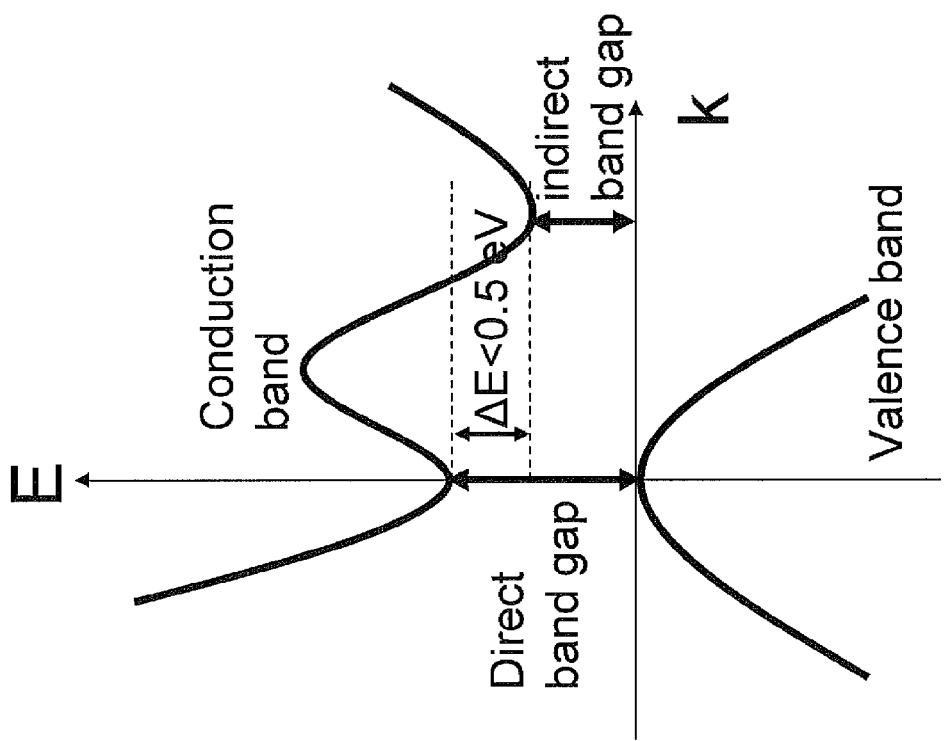
FIG. 1 is an energy band diagram of an indirect band gap semiconductor material with an energy difference between the direct and indirect band gaps.

The invention involves forming novel light emitting devices using indirect bandgap materials. Doped, indirect elemental semiconductor materials, such as germanium, can be engineered as a gain medium for lasing. The invention extends this observation to indirect compound semiconductor materials of various compositions of Al, In, Ga, P, and As for lasing in the wavelength range between 500 nm and 560 nm.

FIG. 1 shows an energy band diagram of an indirect band gap semiconductor material with an energy difference between the direct and indirect band gaps of less than 0.5 eV, which is defined as a "near-direct gap material" herein. These materials can be band-engineered by strain and n-type doping to achieve light emission at traditionally inaccessible wavelengths. Indirect gap materials are traditionally considered unsuitable for efficient light emitters and lasers due to the low radiative recombination rate. However, if the direct band gap of an indirect gap materials is close enough to the indirect gap (within a difference of 0.5 eV), then it is possible to use n-type doping to till electrons into the indirect valley and compensate this energy difference to obtain efficient light emission from the direct gap transition.

Adequate strain can also be incorporated to further enhance the direct gap emission from the indirect gap material. As an example for green lasers/LEDs, an indirect gap InGaP alloy with a Ga content of 73-95% can be adopted for light emission between 500-560 nm. In this case the direct band gap is larger than the indirect band gap by less than 0.25 eV, and this small difference can be compensated with an n-type doping of $10^{17}$-$10^{20}$ cm$^{-3}$ and a tensile strain of up to 3%. The InGaP material with a Ga content of 73-90% can be grown on a lattice-matched SiGe buffer layer for high crystal quality, or a SiGe buffer layer with a larger lattice constant to obtain tensile strain. The indirect gap InGaP layer can also be grown on GaP or GaAs substrates. Another example is indirect gap AlGaAs with an Al content of 50-90%. In this case, the direct band gap is larger than the indirect band gap by less than 0.4 eV, and the difference can be compensated by an n-type doping of $10^{18}$-$10^{21}$ cm$^{-3}$ and a tensile strain of up to 3% to obtain green emission from the direct gap transition. Other examples include InAlP with Al content >0.45 and indirect gap InAlAs. The same principle is also applicable to II-VI semiconductors as well as quantum-confined structures.

FIG. 2A shows a heterojunction structure 2 used to form surface emitting LEDs and lasers. The heterojunction 2 includes a P+ electrode 4, N+ electrode 6, and a n-type near-direct gap material 8 positioned between the P+ electrode 4 and N+ electrode 6. The n-type near-direct gap material 8 has an energy difference between the direct and indirect bandgap of less 0.5 eV. An optical reflector 10 is positioned on a side region of the heterojunction 2. A voltage source 12 provides a forward bias that injects carriers into the n-type near-direct gap material 8. This produces light energy which is then reflected by the optical reflector 10 back into the heterojunction 2 and outputted as a light signal 11 of a specified color or display. The near-direct band gap material 8 can include n-type doping or tensile strain or both to achieve light emission.

FIG. 2B shows a quantum well structure 14 formed in accordance with the invention. The quantum well structure includes a P+ electrode 26, N+ electrode 28, and a stacked structure 30 positioned between the P+ electrode 26 and N+ electrode 28. The stacked structure 30 includes a number of alternating structures that include two barrier 16, 18 layers and n-type near-direct gap material 20 positioned between the two barrier layers 16, 18. The n-type near-direct gap material 20 has an energy difference between the direct and indirect bandgap of less 0.5 eV. An optical reflector 22 is positioned on a side region of the quantum well structure 14. A voltage source 24 provides a forward bias that injects carriers into the n-type near-direct gap materials 20. This produces light energy which is then reflected by the optical reflector 22 back into the quantum well structure 14 and outputted as a light signal 32 of a specified color or display. The near-direct band gap materials 20 can include n-type doping or tensile strain or both to achieve light emission.

FIG. 3A shows a heterojunction 36 that is similar to the heterojunction 2 described in FIG. 2A, however an optical reflector 38 is positioned on the bottom region of the heterojunction 36 that produces a light signal 44 originating from the top region of the heterojunction 36. FIG. 3B shows a quantum well structure 40 that is similar to the quantum well structure 14 of FIG. 2B, however an optical reflector 42 is positioned on the bottom region of the quantum well structure 40 that produces a light signal 46 originating from the top region of the quantum well structure 40.

The major advantage of the inventive approach in engineering emission wavelengths is that it effectively extends the emission capability of a material system to a wavelength range traditionally considered inaccessible. For example, InGaP system is conventionally considered unsuitable for truly green emission yet the invention makes it possible. Using the inventive approach within the same material system by n-type doping and strain is a much easier solution than completely changing the material system just to reach a particular emission wavelength, especially considering that some of these material changes significantly increase fabrication cost. The invention also enables integration of different colors of lasers or LEDs using the same material system at relatively low cost.

Although the present invention has been shown and described with respect to several preferred embodiments thereof, various changes, omissions and additions to the form and detail thereof, may be made therein, without departing from the spirit and scope of the invention.

What is claimed is:

1. A light emitting device comprising:
   at least one first semiconductor material layers;
   at least one second semiconductor material layers; and
   at least one near-direct band gap material layers being positioned between said at least one first semiconductor layers and said at least one second semiconductor material layers, wherein said at least one first semiconductor layers and said at least one second material layers having a larger band gap than the at least one near-direct band gap material layers, said at least one near-direct band gap material layers having an energy difference between the direct and indirect band gaps of less than 0.5 eV.

2. The light emitting device of claim 1, wherein said at least one near-direct band gap material layers comprise n-type doping to achieve light emission.

3. The light emitting device of claim 1, wherein said at least one near-direct band gap material layers comprise indirect band gap materials.

4. The light emitting device of claim 3, wherein said at least one near-direct band gap material layers comprise tensile strain to achieve light emission of said indirect band gap materials.

5. The light emitting device of claim 3, wherein said indirect bandgap materials comprise Al, In, Ga, P, or As.

6. The light emitting device of claim 1, wherein said at least one near-direct band gap material layers comprise n-type doping and tensile strain to achieve light emission.

7. The light emitting device of claim 1 further comprising an optical reflector positioned on or near said light emitting device.

8. The light emitting device of claim 1 further comprising a voltage source providing a forward bias that injects carriers into said one or more near-direct gap material layers.

9. The light emitting device of claim 1, wherein said at least one first semiconductor material layers and said at least one second semiconductor material layers comprise one or more barrier layers.

10. The light emitting device of claim 1, wherein said at least one first semiconductor material layers and said at least one second semiconductor material layers comprise doped electrodes.

* * * * *